(12) United States Patent
Jung

(10) Patent No.: US 8,766,352 B2
(45) Date of Patent: Jul. 1, 2014

(54) SEMICONDUCTOR DEVICES AND METHOD OF MANUFACTURING THE SAME

(75) Inventor: Young Kyun Jung, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 13/218,971

(22) Filed: Aug. 26, 2011

(65) Prior Publication Data

US 2012/0049267 A1 Mar. 1, 2012

(30) Foreign Application Priority Data

Aug. 27, 2010 (KR) .......................... 10-2010-0083464

(51) Int. Cl.
*H01L 29/78* (2006.01)
*H01L 21/336* (2006.01)

(52) U.S. Cl.
USPC .............. 257/324; 257/E29.262; 257/E21.41; 257/321; 438/268

(58) Field of Classification Search
USPC .................................. 257/390, 391, 321–324
See application file for complete search history.

(56) References Cited

U.S. PATENT DOCUMENTS

| | | | |
|---|---|---|---|
| 8,148,769 B2 * | 4/2012 | Kito et al. ...................... | 257/321 |
| 2006/0175656 A1 * | 8/2006 | Govoreanu et al. ............ | 257/321 |
| 2008/0149913 A1 * | 6/2008 | Tanaka et al. .................. | 257/5 |
| 2011/0018050 A1 * | 1/2011 | Fujiwara et al. ............... | 257/324 |
| 2011/0024816 A1 * | 2/2011 | Moon et al. .................... | 257/314 |
| 2011/0032772 A1 * | 2/2011 | Aritome .................... | 365/185.29 |
| 2011/0291176 A1 * | 12/2011 | Lee et al. ....................... | 257/324 |

FOREIGN PATENT DOCUMENTS

KR 1020080028699 4/2008
KR 1020100054100 5/2010

OTHER PUBLICATIONS

Notice of Preliminary Rejection issued from Korean Intellectual Property Office on Aug. 9, 2011.

* cited by examiner

*Primary Examiner* — Marc Armand
*Assistant Examiner* — Quinton Brasfield
(74) *Attorney, Agent, or Firm* — IP & T Group LLP

(57) ABSTRACT

A semiconductor device includes a pipe channel layer formed over a substrate, a first vertical channel layer formed over the pipe channel layer to couple the pipe channel layer to a bit line, a second vertical channel layer formed over the pipe channel layer to couple the pipe channel layer to a source line, a multi-layer comprising a charge trap layer and formed to surround the first vertical channel layer, the second vertical channel layer, and the pipe channel layer, an insulating barrier layer formed to surround the multi-layer, a plurality of first conductive layers formed between the pipe channel layer and the bit line, wherein the first vertical channel layer passes through the first conductive layers, and a plurality of second conductive layers formed between the pipe channel layer and the source line, wherein the second vertical layer passes through the second conductive layers.

17 Claims, 18 Drawing Sheets

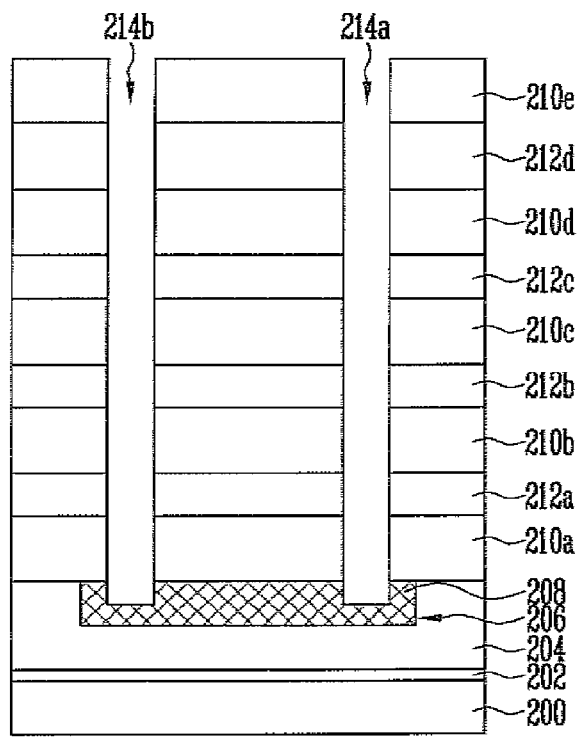
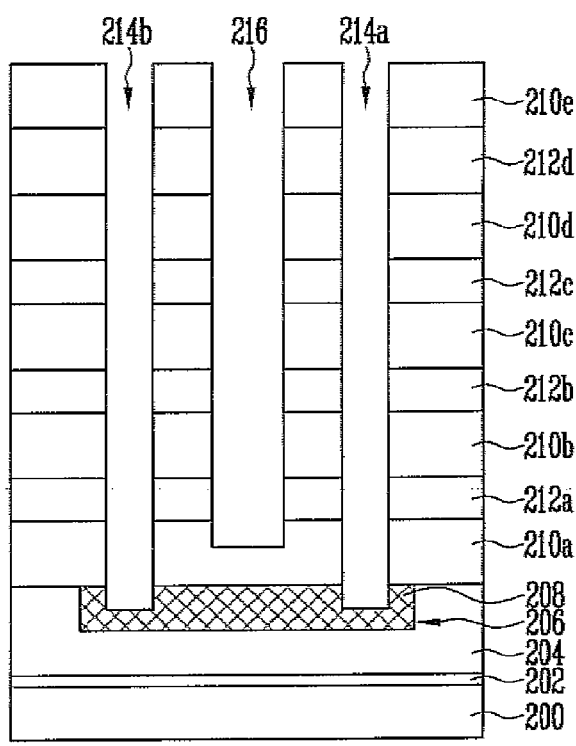

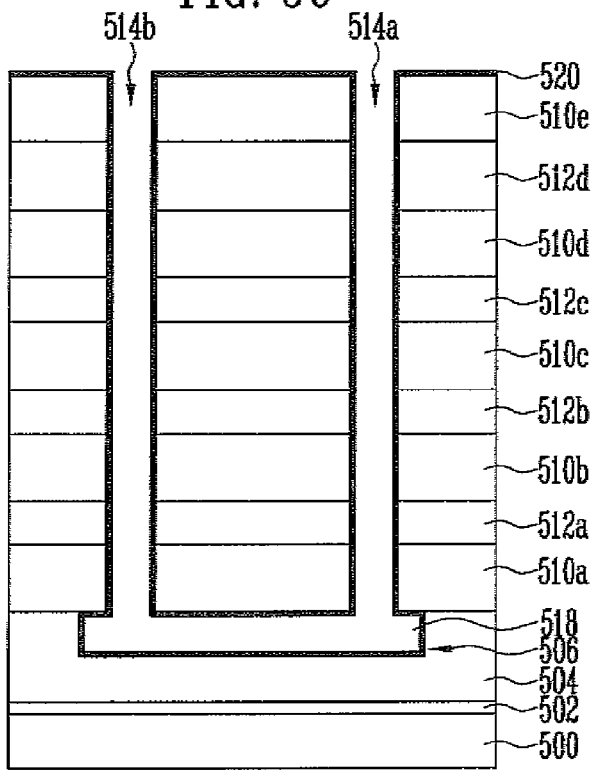
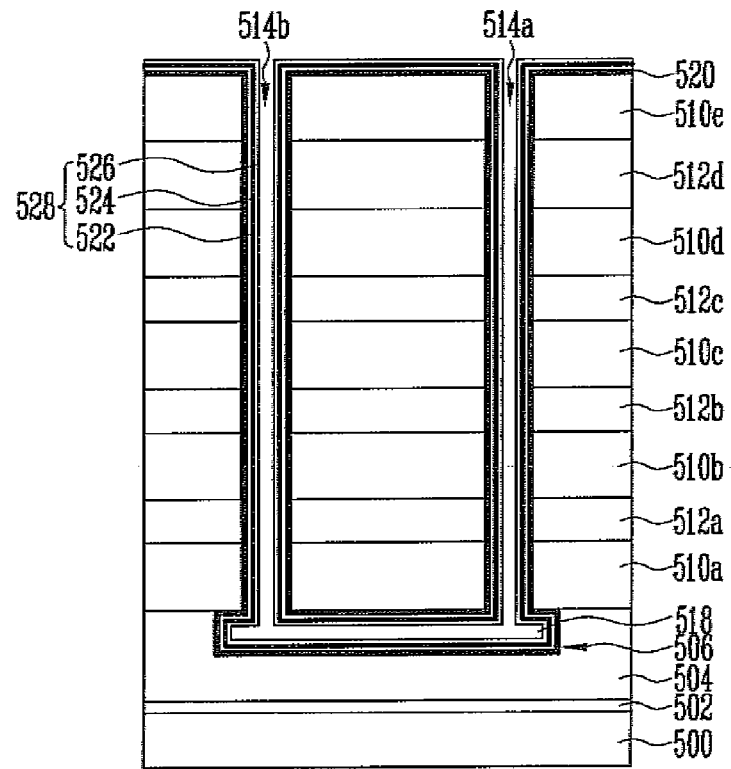

SEMICONDUCTOR DEVICES AND METHOD OF MANUFACTURING THE SAME

CROSS-REFERENCE TO RELATED APPLICATION

Priority to Korean patent application number 10-2010-0083464 filed on Aug. 27, 2010, the entire disclosure of which is incorporated by reference herein, is claimed.

BACKGROUND

Exemplary embodiments relate to semiconductor devices and a method of manufacturing the same and, more particularly, to nonvolatile memory devices and a method of manufacturing the same.

A NAND flash memory device is an example of a nonvolatile memory device that includes a memory array of a plurality of memory blocks. Each of the memory blocks may include a plurality of memory strings. The memory string is coupled between a bit line and a source line. More specifically, the memory string includes a drain select transistor having a drain coupled to the bit line, a source select transistor having a source coupled to the source line, and a plurality of memory cells coupled in series between the select transistors (that is, the drain select transistor and the source select transistor).

In general, the memory string is formed on a substrate as a 2-D structure. In order to increase the integration degree, the cell size is to be reduced. However, further reductions in the cell size are reaching physical limits. For this reason, there is proposed a memory string having a 3-D structure in which the memory string is vertically formed on the substrate.

In order to vertically form the memory string on the substrate, conductive layers for word lines or select lines (that is, a drain select line and a source select line) are formed on the substrate at desired intervals. Insulating layers are formed between the conductive layers. A layer for forming the channel of the memory string (hereinafter referred to as a vertical channel layer) is formed in a vertical direction to the substrate through the conductive layers and the insulating layers. A multi-layer, including a charge trap layer and an insulating layer, is formed on a surface of the vertical channel layer. Consequently, the multi-layer is formed between the vertical channel layer and the conductive layers.

As described above, the memory string having a 3-D structure is significantly different from the memory string of the 2-D structure in the manufacturing method. The memory string of the 3-D structure may not have high structural reliability due to such a different manufacturing method.

BRIEF SUMMARY

Exemplary embodiments relate to semiconductor devices and a method of manufacturing the same, which are capable of increasing structural stability of a memory string having a 3-D structure and reliability of a manufacturing process thereof.

According to an aspect of this disclosure, there is provided a semiconductor device, including a pipe channel layer formed over a substrate; a first vertical channel layer formed over the pipe channel layer to couple the pipe channel layer to a bit line; a second vertical channel layer formed over the pipe channel layer to couple the pipe channel layer to a source line; a multi-layer comprising a charge trap layer and formed to surround the first vertical channel layer, the second vertical channel layer, and the pipe channel layer; an insulating barrier layer formed to surround the multi-layer; a plurality of first conductive layers formed between the pipe channel layer and the bit line, wherein the first vertical channel layer passes through the first conductive layers; and a plurality of second conductive layers formed between the pipe channel layer and the source line, wherein the second vertical layer passes through the second conductive layers.

According to another aspect of this disclosure, there is provided a semiconductor device, including a pipe channel layer formed over a substrate; a first vertical channel layer formed over the pipe channel layer to couple the pipe channel layer to a bit line; a second vertical channel layer formed over the pipe channel layer to couple the pipe channel layer to a source line; a multi-layer comprising a charge trap layer and formed to surround the first vertical channel layer, the second vertical channel layer, and the pipe channel layer; a plurality of first conductive layers formed between the pipe channel layer and the bit line, wherein the first vertical channel layer passes through the first conductive layers; a plurality of second conductive layers formed between the pipe channel layer and the source line, wherein the second vertical layer passes through the second conductive layers; insulating layers formed alternately with the first and the second conductive layers, respectively; and an insulating barrier layer formed between the multi-layer formed on the pipe channel layer and a lowest insulating layer of the insulating layers.

According to an aspect of this disclosure, there is provided a method of manufacturing a semiconductor device, including forming a sacrificial layer pattern in a substrate; alternately forming a plurality of insulating layers and a plurality of conductive layers over the substrate having the sacrificial layer pattern; forming channel holes through which the sacrificial layer pattern is exposed by etching the plurality of insulating layers and the plurality of conductive layers; removing the sacrificial layer pattern through the channel holes; forming an insulating barrier layer on inner surfaces of a region from which the sacrificial layer pattern is removed and the channel holes; forming a multi-layer, including a charge trap layer, on a surface of the insulating barrier layer; forming a channel layer in the region from which the sacrificial layer pattern is removed and the channel holes; and forming a first trench by etching the insulating layers and the conductive layers between the channel holes.

According to another aspect of this disclosure, there is provided a method of manufacturing a semiconductor device, including forming a sacrificial layer pattern in a substrate; forming an insulating barrier layer over the substrate having the sacrificial layer pattern; alternately forming a plurality of insulating layers and a plurality of conductive layers over the insulating barrier layer; forming channel holes through which the insulating barrier layer formed over the sacrificial layer pattern is exposed by etching the plurality of insulating layers and the plurality of conductive layers; removing an exposed portion of the insulating barrier layer and the sacrificial layer pattern through the channel holes; forming a multi-layer, including a charge trap layer, on inner surfaces of a region from which the sacrificial layer pattern is removed and the channel holes; forming a channel layer in the region from which the sacrificial layer pattern is removed and the channel holes; and forming a trench by etching the insulating layers and the conductive layers between the channel holes.

BRIEF DESCRIPTION OF THE DRAWINGS

FIGS. 2A to 2E are cross-sectional views of the semiconductor device taken along line X-X' in FIG. 1B in order to illustrate a method of manufacturing the semiconductor device according to an exemplary embodiment of this disclosure;

FIGS. 5A to 5G are cross-sectional views of the semiconductor device taken along line X-X' in FIG. 4 in order to illustrate a method of manufacturing the semiconductor device according to another exemplary embodiment of this disclosure;

DESCRIPTION OF EMBODIMENTS

Hereinafter, some exemplary embodiments of the present disclosure will be described in detail with reference to the accompanying drawings. The figures are provided to enable those of ordinary skill in the art to make and use the embodiments of the disclosure.

Figure 1A:
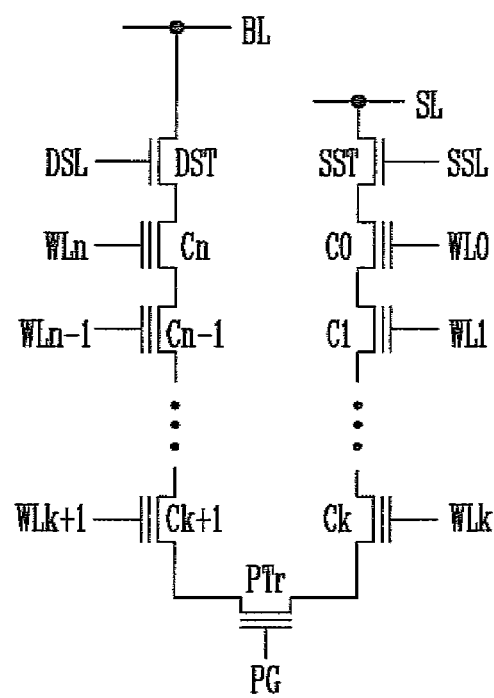
FIG. 1A is a circuit diagram illustrating a semiconductor device according to an exemplary embodiment of this disclosure.

FIG. 1A is a circuit diagram illustrating a semiconductor device according to an exemplary embodiment of this disclosure.

Referring to FIG. 1A, a typical memory string of a NAND flash memory device may include a drain select transistor DST having a drain coupled to a bit line BL, a source select transistor SST having a source coupled to a source line SL, and a plurality of memory cells Co to Cn coupled in series between the select transistors (that is, the drain select transistor and the source select transistor).

A pipe transistor PTr is coupled between a pair of memory cells Ck and Ck+1 located in the middle of the memory string of a 3-D structure. Accordingly, some (e.g., memory cells C0 to Ck) of the memory cells Co to Cn included in the memory string are coupled in series between the source select transistor SST and the pipe transistor PTr to form a first memory group. The remaining memory cells Ck+1 to Cn are coupled in series between the drain select transistor DST and the pipe transistor PTr to form a second memory group.

The pipe transistor PTr is formed in a substrate. The drain select transistor DST and the memory cells CK+1 to Cn (that is, the second memory group) are arranged in series between the bit line BL and the pipe transistor PTr in a vertical direction to the substrate. The source select transistor SST and the memory cells C0 to Ck (that is, the first memory group) are arranged in series between the source line SL and the pipe transistor PTr in a vertical direction to the substrate. According to an example, the number of memory cells C0 to Ck of the first memory group is identical with the number of memory cells Ck+1 to Cn of the second memory group. Since the memory cells Co to Cn are vertically arranged with respect to the substrate, the channel direction of the memory cells Co to Cn is a vertical direction to the substrate. Furthermore, since the memory cells Co to Cn of the memory string are divided into the first and the second memory groups, two channel layers that are vertically stacked with respect to the substrate are included in one memory string.

The pipe transistor PTr performs an operation of electrically coupling the channel region of the memory cells C0 to Ck of the first memory group and the channel region of the memory cells Ck+1 to Cn of the second memory group. The structure of the semiconductor device including the 3-D memory string is described in more detail as follows.

Figure 1B:
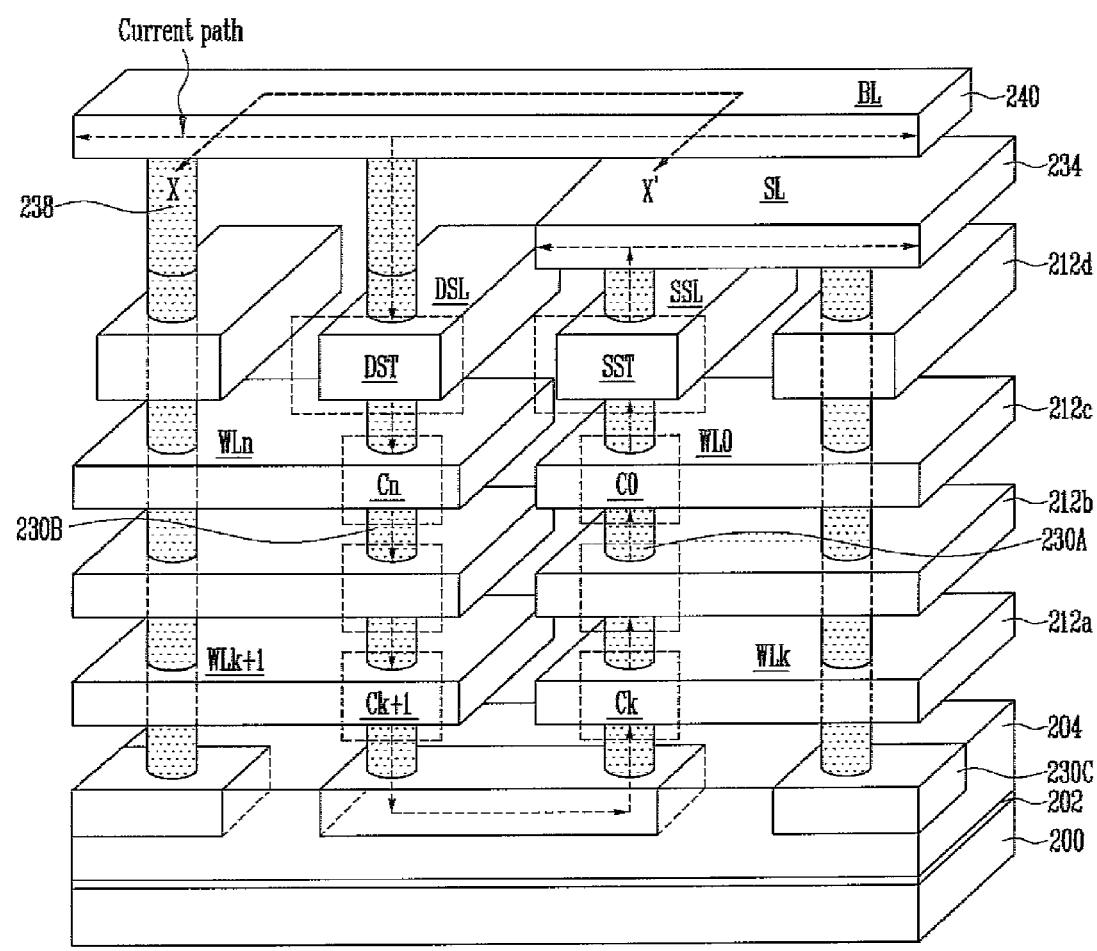
FIG. 1B is a perspective view illustrating the structure of the semiconductor device of FIG. 1A.

FIG. 1B is a perspective view illustrating the structure of the semiconductor device of FIG. 1A.

Referring to FIG. 1B, a pipe gate conductive layer 204 formed of a conductive layer is formed over a substrate 200. In order to isolate the pipe gate conductive layer 204 from the substrate 200, an insulating layer 202 is formed between the substrate 200 and the pipe gate conductive layer 204. The pipe gate conductive layer 204 is used as the gate of a pipe transistor for electrically coupling first and second vertical channel layers 230A and 230B. A trench is formed in a specific region of the pipe gate conductive layer 204. A pipe channel layer 230C formed of a polysilicon layer is formed in the trench of the pipe gate conductive layer 204.

Pairs of word lines WL0 to WLn formed of a conductive layer are arranged in multiple layers over the substrate 200 over which the pipe gate conductive layer 204 is formed. The word lines WL0 to WLk, among the pairs of word lines arranged in multiple layers, become a first word line group. The first vertical channel layer 230A penetrates/passes through the word lines WL0 to WLk (that is, the first word line group). The word lines WLk+1 to WLn, among the pairs of word lines arranged in the multiple layers, become a second word line group. The second vertical channel layer 230B penetrates the word lines WLk+1 to WLn (that is, the second word line group).

A drain select line DSL and a source select line SSL, formed as a conductive layer 212d, are formed over the word lines WL0 and WLn at the same level. The source select line SSL is placed on the highest word line WL0 of the first word line group, and the drain select line DSL is placed on the highest word line WLn of the second word line group.

A bit line 240 (BL) and a source line 234 (SL) are placed over the select lines 212d (DSL and SSL). The bit line 240 and the source line 234 may be placed in different layers, and the bit line 240 may be placed in a higher layer than the source line 234. An insulating layer (not shown) is formed between the word lines WL0 to WLn, the select lines 212d, the bit line 240, and the source line 234 in order to isolate the lines.

The first vertical channel layer 230A is formed between the source line 234 and the pipe channel layer 230C to penetrate the source select line 212d (SSL) and the word lines WL0 to WLk (that is, the first word line group) in order to couple the source line 234 and the pipe channel layer 230C. Furthermore, the second vertical channel layer 230B is formed between the bit line 240 and the pipe channel layer 230C to penetrate the drain select line 212d (DSL) and the word lines WLk−1 to WLn (that is, the second word line group) in order to couple the bit line 240 and the pipe channel layer 230C. When a channel is formed in the pipe channel layer 230C by voltage supplied to the pipe gate conductive layer 204, the first and the second vertical channel layers 230A and 230B are electrically coupled.

Meanwhile, if the bit line 240 (BL) is placed in a higher layer than the source line 234 (SL), a bit line contact plug 238 may be further formed between the second vertical channel layer 230B and the bit line 240 in order to couple the second vertical channel layer 230B and the bit line 240. Accordingly, the first and the second vertical channel layers 230A and 230B are extended in a vertical direction to the substrate 200. The first and the second vertical channel layers 230A and 230B and the pipe channel layer 230C may be made of the same material and may be formed in the same process. This is described in detail later.

A multi-layer (refer to 228 of FIG. 2D) is formed to surround the first and the second vertical channel layers 230A and 230B and the pipe channel layer 230C. Accordingly, the multi-layer is formed at the interface between the vertical channel layers 230A and 230B and the word lines WL0 to WLn and between the pipe channel layer 230C and the pipe gate conductive layer 204. The multi-layer may be formed of a stack layer, including an insulating layer, a charge trap layer, and an insulating layer (refer to 228 of FIG. 2D).

In the above structure, a portion of the first vertical channel layer 230A, having the multi-layer formed thereon, which is surrounded by the conductive layer 212d for the source select line SSL becomes/forms a source select transistor SST. A portion of the second vertical channel layer 230B surrounded by the conductive layer 212d for the drain select line DSL becomes a drain select transistor DST. Portions of the first and the second vertical channel layers 230A and 230B, having the multi-layer formed thereon, which are surrounded by the word lines WL0 to WLn become the memory cells C0 to Cn. Accordingly, the source select transistor SST and the memory cells C0 to Ck (that is, the first memory group) are arranged in series between the source line 234 (SL) and the substrate 200. The drain select transistor DST and the memory cells Cn to Ck+1 (that is, the second memory group) are vertically arranged between the bit line 240 (BL) and the substrate 200.

Hereinafter, a method of manufacturing the semiconductor device having the above structure is described.

FIGS. 2A to 2D are cross-sectional views of the semiconductor device taken along line X-X' in FIG. 1B in order to illustrate a process of manufacturing the semiconductor device according to an exemplary embodiment of this disclosure.

Referring to FIG. 2A, the insulating layer 202 is formed on the substrate 200. The first conductive layer 204 for forming a pipe gate is formed on the insulating layer 202. The insulating layer 202 is used as a pipe gate insulating layer for isolating the pipe gate conductive layer 204 from the substrate 200.

The trench 206 is formed by etching part of the pipe gate conductive layer 204. Next, the trench 206 is filled with a sacrificial layer 208. The sacrificial layer 208 may be formed of a nitride layer.

A plurality of insulating layers 210a to 210e and a plurality of conductive layers 212a to 212d are formed by alternately forming the insulating layer and the conductive layer on the entire structure including the sacrificial layer 208. Here, the insulating layer 210a is formed prior to the conductive layer 212a. The insulating layers 210a to 210e may be formed of a silicon oxide layer, and the conductive layers 212a to 212d may be formed of a polysilicon layer.

Although four conductive layers 212a to 212d are illustrated, according to an example, the number of conductive layers may equal a half of the sum of the number of select lines and the number of word lines. Here, the highest conductive layer 212d is used to form the select lines (that is, the drain select line and the source select line), and the remaining conductive layers 212a to 212C are used to form the word lines.

Next, channel holes 214a and 214b are formed by etching the insulating layers 210a to 210e and the conductive layers 212a to 212d so that both ends of the sacrificial layer 208 are exposed. The channel holes 214a and 214b are formed to define regions in which the first and second vertical channel layers will be formed. In a subsequent process, the first and the second vertical channel layers are formed in the respective channel holes 214a and 214b.

Referring to FIG. 2B, in order to form the pair of word lines in each layer by dividing the respective conductive layers 212a to 212c, a trench 216 is formed by etching part of the insulating layers 210b to 210e and the conductive layers 212a to 212d. The trench 216 is formed in a line form and formed in a direction to cross the direction of the bit line. Furthermore, the trench 216 is formed between the channel holes 214a and 214b that define the respective regions in which the first and the second vertical channel layers will be formed.

Meanwhile, the trench 216 is formed by etching a part of the insulating layers 210b to 210e and the conductive layers 212a to 212d up to the lowest conductive layer 212a. However, the lowest insulating layer 210a is not etched so that the sacrificial layer 208 is not exposed.

Accordingly, the conductive layers 212a to 212d are divided into the conductive layers in which the first channel hole 214a is formed and the conductive layers in which the second channel hole 214b is formed. The conductive layers in which the first channel hole 214a is formed are used to form the source select line (refer to SSL of FIG. 1B) and the word lines (refer to WL0 to WLk of FIG. 1B) corresponding to a half of the word lines. The conductive layers in which the second channel hole 214b is formed are used to form the drain select line (refer to DSL of FIG. 1B) and the word lines (refer to WLk+1 to WLn of FIG. 1B) corresponding to the remaining half of the word lines.

Figure 2C:
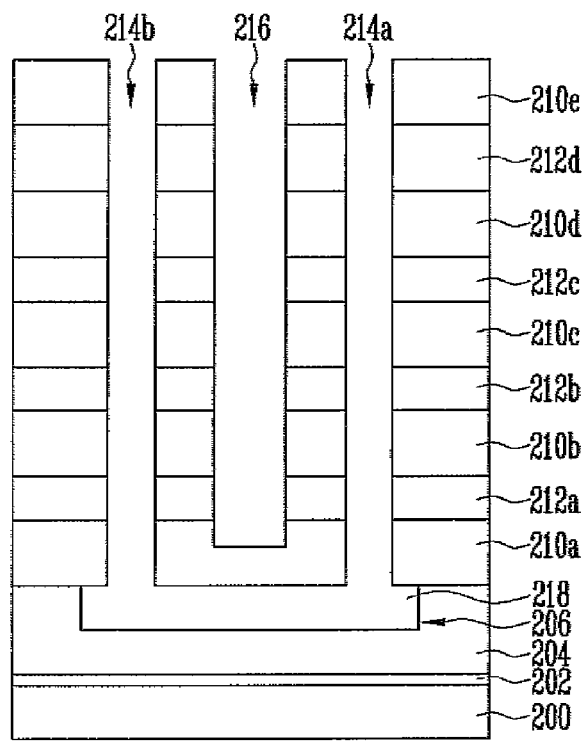

Referring to FIG. 2C, the sacrificial layer 208 is removed to form a space 218 in the trench 206 of the pipe gate conductive layer 204. The sacrificial layer 208 may be removed using a phosphoric acid solution if the sacrificial layer 208 is formed of a nitride layer.

Figure 2D:
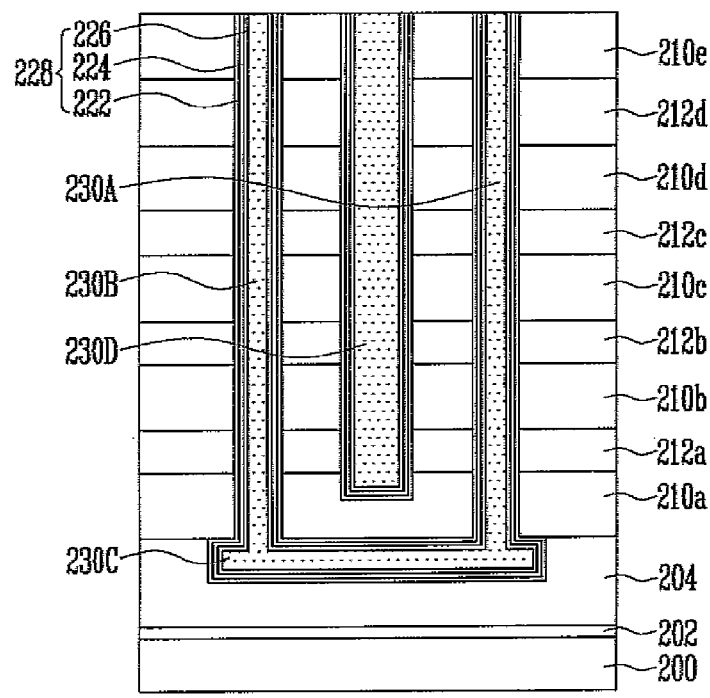
Figure 2E:
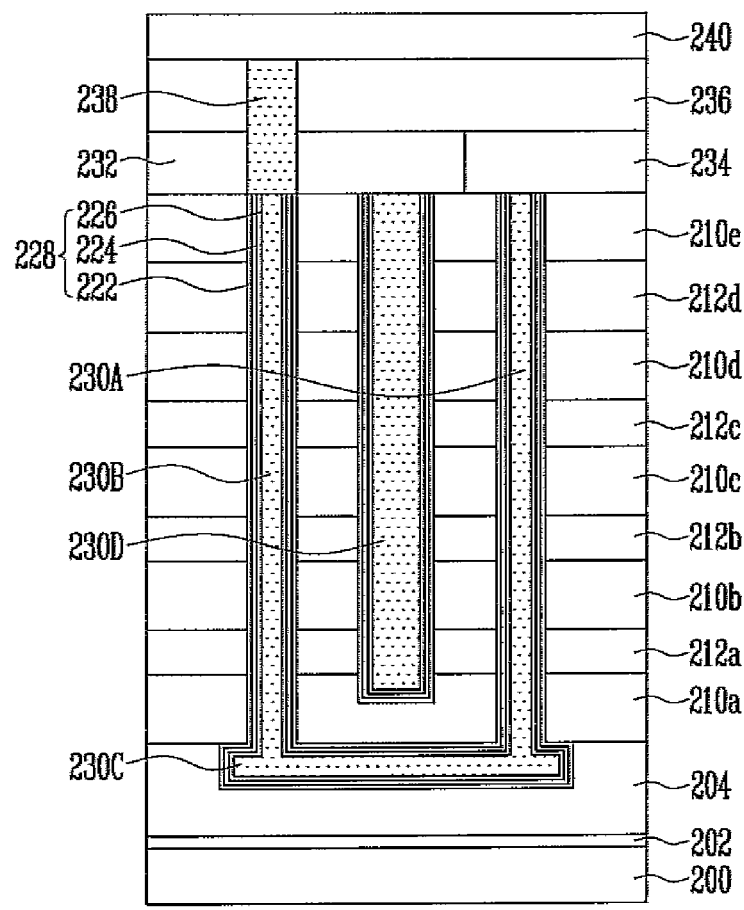

Referring to FIG. 2D, the multi-layer 228, including insulating layers 222 and 226 and a charge trap layer 224, is formed on the sidewalls of the first and the second channel holes 214a and 214b and the entire inner surface of the trench 206 of the pipe gate conductive layer 204. Next, the first and the second channel holes 214a and 214b and the trench 206 of the pipe gate conductive layer 204 are filled with polysilicon layers 230A, 230B, and 230C.

Accordingly, the first vertical channel layer 230A is formed of the polysilicon layer within the first channel hole 214a. The second vertical channel layer 230B is formed of the polysilicon layer within the second channel hole 214b. The pipe channel layer 230C is formed of the polysilicon layer within the trench 206 of the pipe gate conductive layer 204.

Meanwhile, in the process of forming the multi-layer 228 and the polysilicon layers 230A to 230C, the trench 216 may also be filled with the multi-layer and the polysilicon layer. Although the polysilicon layer is formed in the trench 216, the polysilicon layer may be isolated from the vertical channel layers 230A and 230B or the pipe channel layer 230C.

Figure 3A:
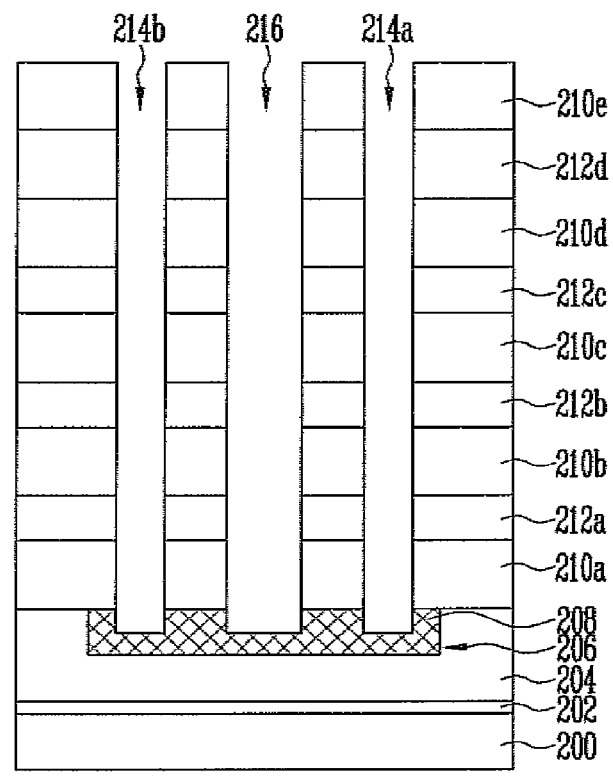
FIGS. 3A and 3B are cross-sectional views illustrating features which may be generated when the lowest insulating layer is over-etched in forming the trench in FIG. 2B.
Figure 3B:
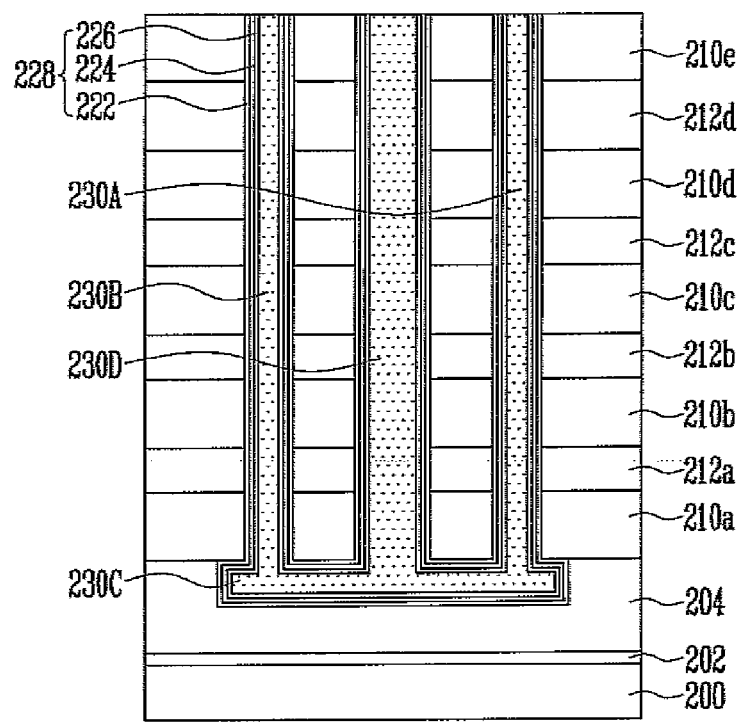

FIGS. 3A and 3B are cross-sectional views illustrating features that occur when the lowest insulating layer is over-etched in forming the trench 216 in FIG. 2B.

Referring to FIG. 3A, in order to form the trench 216, the insulating layers 210b to 210e and the conductive layers 212a to 212d are to be etched, but the lowest insulating layer 210a remains intact. However, in performing the above-described process, the lowest conductive layer 212a may not be fully etched and thus fully divided. In order to address such features, when etching the lowest conductive layer 212a, the etch process is performed by setting a target etch thickness to be sufficiently thicker than the lowest conductive layer 212a. In this case, the insulating layers 210b to 210e and the conductive layers 212a to 212d may be etched up to the lowest insulating layer 210a to expose the sacrificial layer 208 through the trench 216 as shown in FIG. 3A.

Referring to FIG. 3B, after removing the sacrificial layer 208, the multi-layer 228 and the polysilicon layers 230A to 230C are formed within the first and the second channel holes 214a and 214b and the trench 206, as in FIG. 2D. In this case, since the lowest insulating layer 210a has been removed, the polysilicon layer 230D formed in the trench 216 may be coupled to the pipe channel layer 230C at the bottom of the trench 216 (see 'A' in FIG. 3C).

Figure 3C:
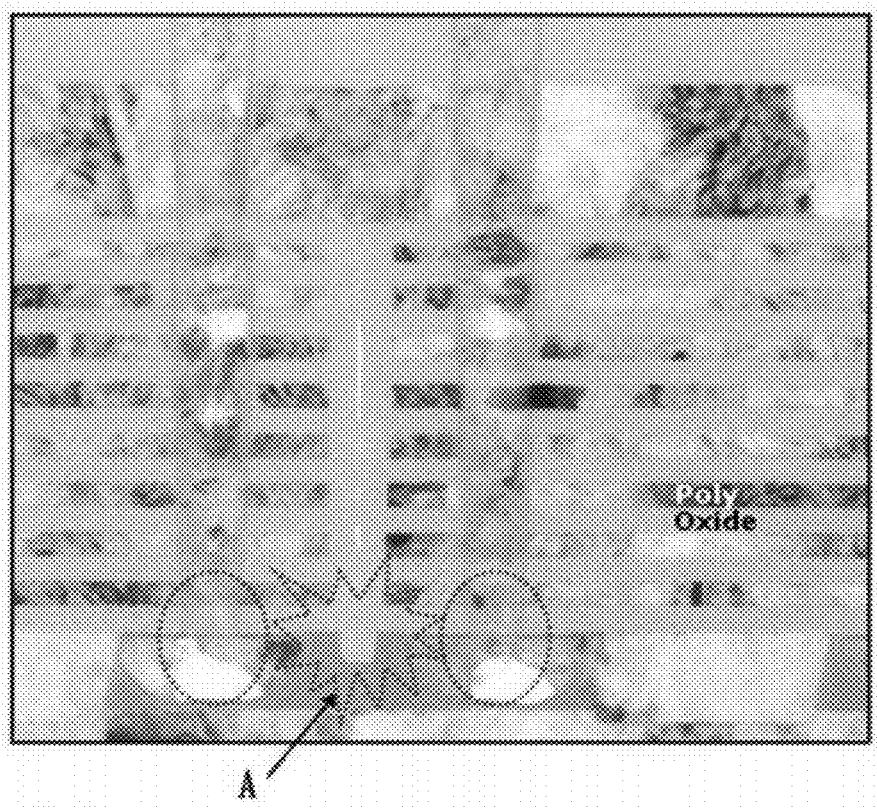
FIG. 3C illustrates the cross section of the semiconductor device in detail where for the features discussed above in connection with in FIGS. 3A and 3B are shown.

FIG. 3C illustrates the cross section of the semiconductor device in detail where for the features discussed above in connection with in FIGS. 3A and 3B are shown.

According to FIG. 3C, the polysilicon layer formed in the trench is coupled to the pipe channel layer at the bottom of the trench (indicated by 'A').

Another embodiment capable of addressing the above-discussed features is described as follows.

Figure 4:
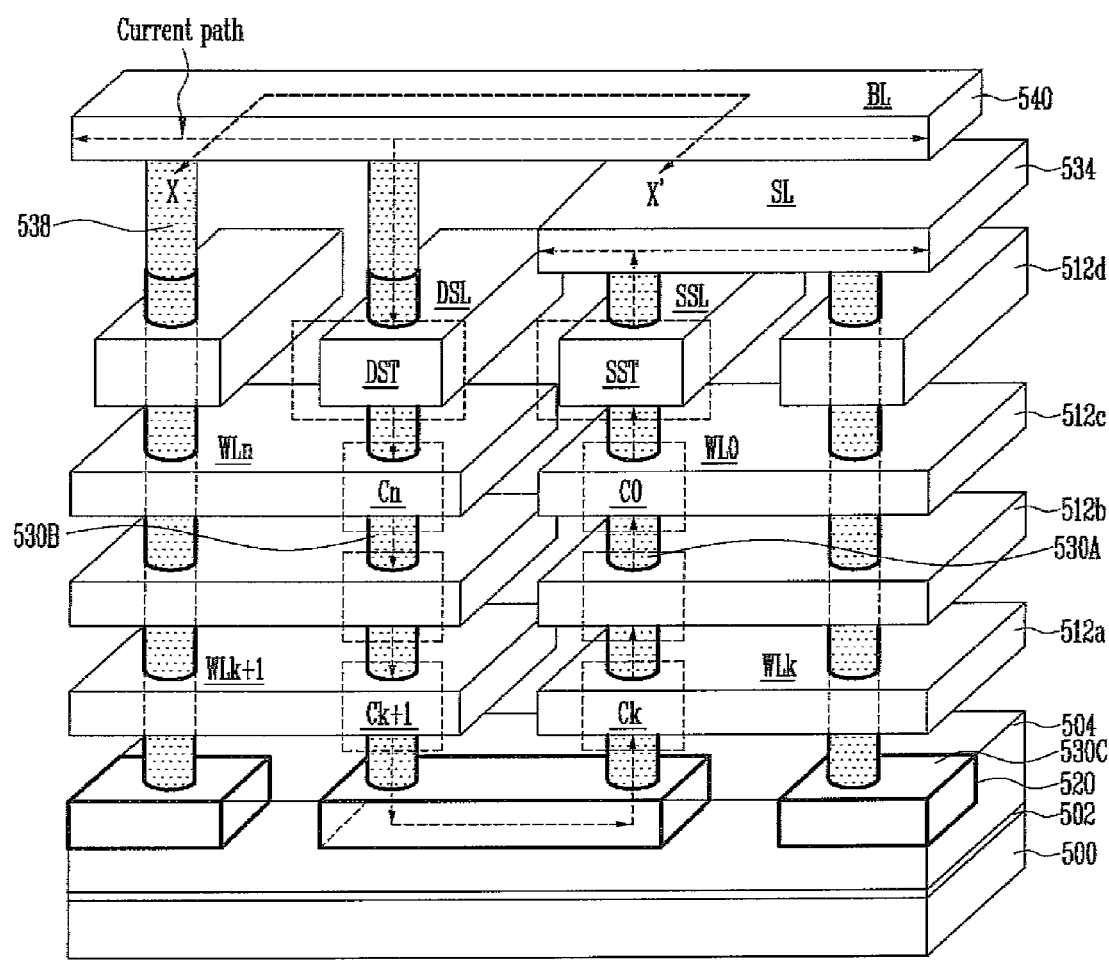
FIG. 4 is a perspective view illustrating the structure of a semiconductor device according to another exemplary embodiment of this disclosure.

FIG. 4 is a perspective view illustrating the structure of a semiconductor device according to another exemplary embodiment of this disclosure.

Referring to FIG. 4, compared to the structure described with reference to FIG. 1B, an insulating barrier layer 520 may be further included to protect a multi-layer from being damaged. More specifically, for example, the insulating barrier layer 520 is formed to protect the multi-layer from being damaged during an etch process. The insulating barrier layer 520 may also protect the multi-layer from being damaged due to the infiltration of impurities. To this end, a multi-layer (refer to 528 of FIG. 5D), including a charge trap layer, is formed on a surface of first and second vertical channel layers 530A and 530B and a pipe channel layer 530C, and the insulating barrier layer 520 is formed to surround the multi-layer 528. Meanwhile, the insulating barrier layer 520 may serve as a blocking insulating layer to prevent the electrons or charges of the charge trap layer, included in the multi-layer, from transferring to a conductive layer for word lines. Further, the insulating barrier layer 520 may supplement the function of the blocking insulating layer included in the multi-layer.

Figure 5A:
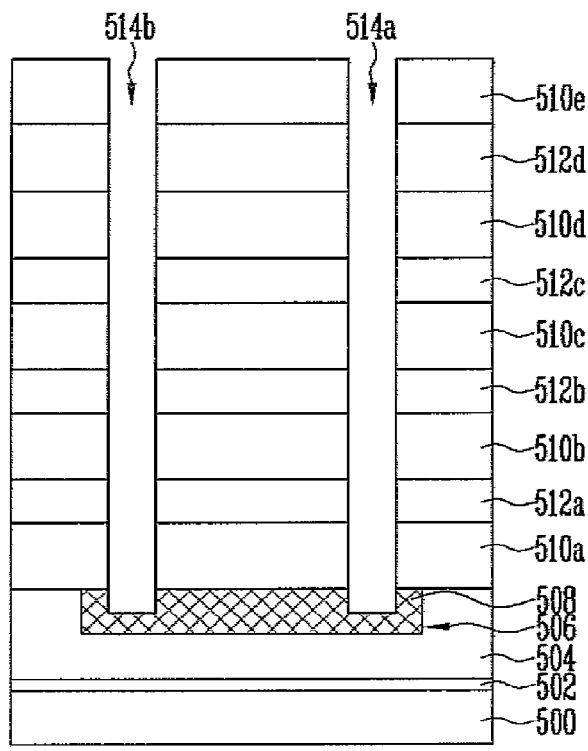
Figure 5B:
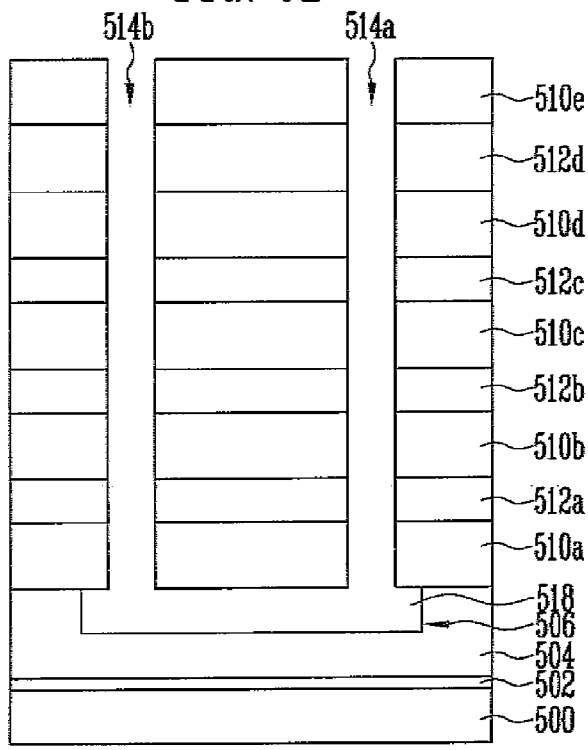
Figure 5E:
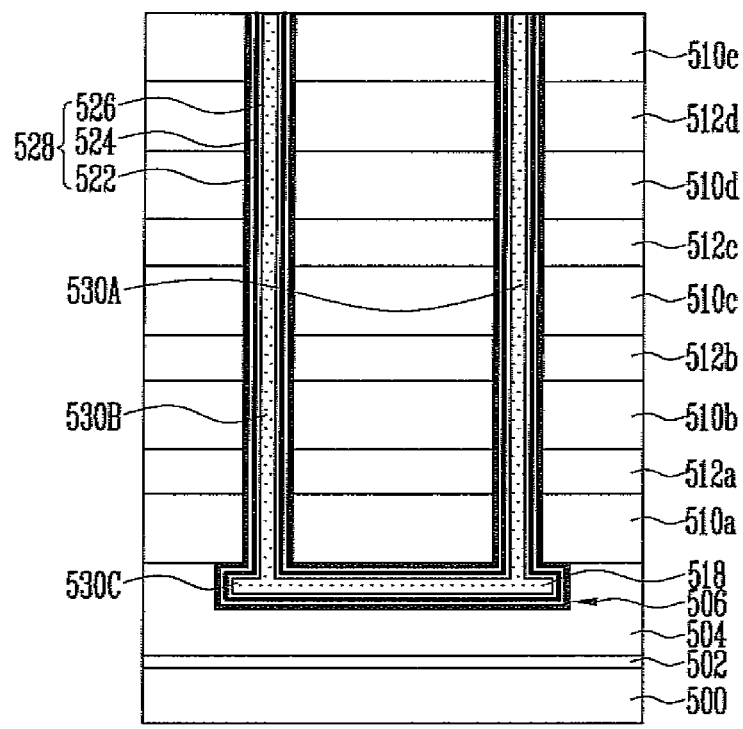
Figure 5F:
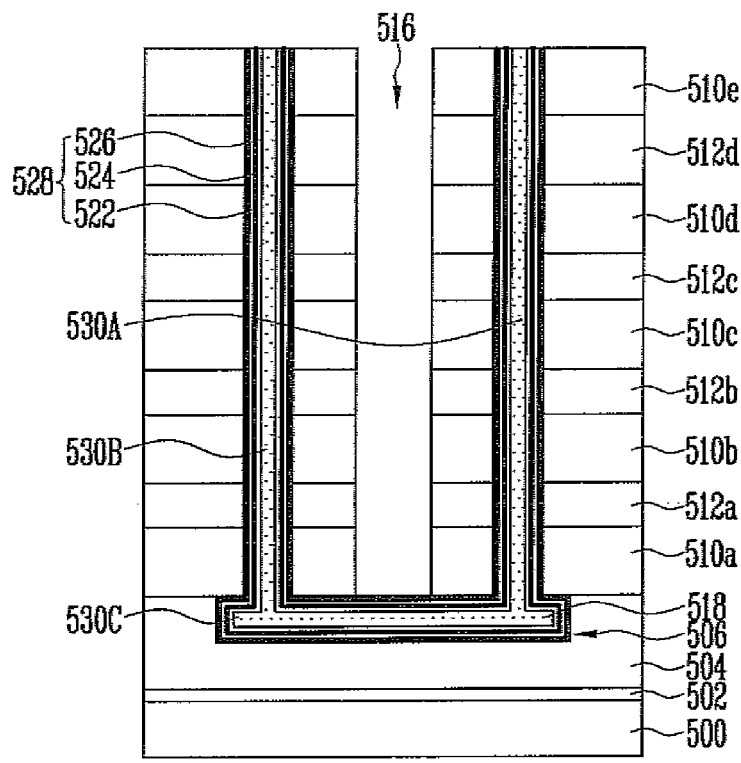

The insulating barrier layer 520 is formed to prevent the multi-layer from being etched or the pipe channel layer 530C from being exposed during the etching insulating layers (refer to 510a to 510e of FIG. 5F), and the conductive layers 512a to 512d between the insulating layers in order to form a trench (refer to 516 of FIG. 5F). To this end, the insulating barrier layer 520 according to an example is made of material having a zero etching rate in response to an etchant (an etch gas or an etching solution) for etching the conductive layer 512a or the insulating layer 510a formed between the conductive layer 512a and the substrate 500. Further, the insulating barrier layer 520 may be formed of an insulating layer having a higher dielectric constant than the layers of the multi-layer. For example, the insulating barrier layer 520 may be formed of an $Al_2O_3$ layer or an $HfO_2$ layer.

A method of manufacturing the semiconductor device including the above-described insulating barrier layer 520 is described as follows.

FIGS. 5A to 5G are cross-sectional views of the semiconductor device taken along line X-X' in FIG. 4 in order to illustrate the method of manufacturing the semiconductor device according to another exemplary embodiment of this disclosure.

Referring to FIG. 5A, an insulating layer 502 is formed on a substrate 500. A conductive layer 504 for forming a pipe gate is formed on the insulating layer 502. A trench 506 is formed by etching part of the pipe gate conductive layer 504. Next, the trench 506 is filled with a sacrificial layer 508. The sacrificial layer 508 may be formed of a nitride layer.

Next, a plurality of insulating layers 510a to 510e and a plurality of conductive layers 512a to 512d are formed by alternately forming the insulating layer and the conductive layer on the entire structure including the sacrificial layer 508. Here, the insulating layer 510a is formed prior to the conductive layer 512a. The insulating layers 510a to 510e may be formed of a silicon oxide layer, and the conductive layers 512a to 512d may be formed of a polysilicon layer.

Although four conductive layers 512a to 512d are illustrated to be formed, according to an example, the number of conductive layers may equal a half of the sum of the number of select lines and the number of word lines. Here, the highest conductive layer 512d is used to form the select lines (that is, the drain select line and the source select line), and the remaining conductive layers 512a to 512C are used to form the word lines.

Next, first and second channel holes 514a and 514b are formed by etching the insulating layers 510a to 510e and the conductive layers 512a to 512d so that the corresponding regions of the sacrificial layer 508 are exposed. The channel holes 514a and 514b are formed to define regions in which the first and second vertical channel layers will be formed. In a subsequent process, the first and the second vertical channel layers are formed in the channel holes 514a and 514b, respectively.

Referring to FIG. 5B, the sacrificial layer is removed. Accordingly, a space 518 is formed in the trench 506 of the pipe gate conductive layer 504. If the sacrificial layer is formed of a nitride layer, the sacrificial layer may be removed using a phosphoric acid solution.

Referring to FIG. 5C, the insulating barrier layer 520 is formed on the sidewalls of the first and the second channel holes 514a and 514b and the entire inner surface of the trench 506 formed in the pipe gate conductive layer 504. Accordingly, the insulating barrier layer 520 is also formed at the bottom of the lowest insulating layer 510a which is exposed through the trench 506.

The insulating barrier layer 520 according to an example is made of material which is less prone to being etched than the conductive layers 512a to 512d or the insulating layers 510a to 510e in response to an etchant for etching the conductive layers 512a to 512d or the insulating layers 510a to 510e (for example, material that does not react with the etchant). For example, the insulating barrier layer 520 may be formed of a nitride layer. Meanwhile, the insulating barrier layer 520 according to an example has a higher dielectric constant than the multi-layer formed in a subsequent process. For example, the insulating barrier layer 520 may be formed of an $Al_2O_3$ layer or an $HfO_2$ layer.

Referring to FIG. 5D, the multi-layer 528, including insulating layers 522 and 526 and a charge trap layer 524, is formed on a surface of the insulating barrier layer 520. For example, the multi-layer 528 may have a stack structure, including an oxide layer, a nitride layer, and an oxide layer. Here, the nitride layer is used as the charge trap layer 524. The first insulating layer 522 of the oxide layer is used as a blocking insulating layer for preventing holes or electrons from transferring from the charge trap layer 524 to the conductive layers 512a to 512d. The second insulating layer 526 of the oxide layer is used as the tunnel insulating layer of a flash memory cell.

When the insulating barrier layer 520 is formed of the high-k insulating layer (i.e., the $Al_2O_3$ layer or the $HfO_2$ layer) as described above, the insulating barrier layer 520 may be used as the blocking insulating layer to replace the first insulating layer 522 of the multi-layer 528. In this case, the nitride layer used as the charge trap layer 524 is placed between the insulating layer 526 and the insulating barrier layer 520.

Referring to FIG. 5E, the first and the second channel holes 514a and 514b and the trench 506 of the pipe gate conductive layer 504 are filled with channel layers 530A, 530B, and 530C.

More specifically, a channel layer is formed on the entire structure including the first and the second channel holes 514a and 514b. Next, the channel layer, the multi-layer, and the insulating barrier layer formed over the highest insulating layer 510e of the insulating layers 510a to 510e are removed by a chemical mechanical polishing process, an etch-back process, or both. Accordingly, the first and the second channel holes 514a and 514b and the trench 506 of the pipe gate conductive layer 504 are filled with the channel layers 530A, 530B, and 530C. Furthermore, the insulating barrier layer 520 and the multi-layer 528 remain, for example, only within the first and the second channel holes 514a and 514b and the trench 518 of the pipe gate conductive layer 504. In other words, the channel layers 530A, 530B, and 530C are surrounded with the multi-layer 528 and the multi-layer 528 is surrounded with the insulating barrier layer 520, within the first and the second channel holes 514a and 514b and the trench 506 of the pipe gate conductive layer 504.

The channel layers 530A, 530B, and 530C may be formed of a polysilicon layer. Accordingly, the first vertical channel layer 530A is formed of the polysilicon layer within the first channel hole 514a. The second vertical channel layer 530B is formed of the polysilicon layer within the second channel hole 514b. The pipe channel layer 530C is formed of the polysilicon layer within the trench 506 of the pipe gate conductive layer 504.

Referring to FIG. 5F, in order to define pairs of word lines in respective layers by dividing the conductive layers 512a to 512d, a trench 516 is formed by etching part of the insulating layers 510a to 510e and the conductive layers 512a to 512d. The trench 516 is formed in a line form between the first and the second vertical channel layers 530A and 530B and in a direction to cross the direction of the bit line.

Accordingly, the conductive layers 512a to 512d are divided into the conductive layers in which the first channel hole 514a is formed and the conductive layers in which the second channel hole 514b is formed. The conductive layers in which the first channel hole 514a is formed are used to form a source select line (refer to SSL of FIG. 4) and word lines (refer to WL0 to WLk of FIG. 4) corresponding to half of the word lines. The conductive layers in which the second channel hole 514b is formed are used to form a drain select line (refer to DSL of FIG. 4) and word lines (refer to WLk+1 to WLn of FIG. 4) corresponding to the remaining half of the word lines.

The conductive layer may not be formed in the trench 516 because the trench 516 is formed after the pipe channel layer 530C is formed as described above. Accordingly, although the lowest insulating layer 510a is etched in the etch process for forming the trench 516, the pipe channel layer 530C may be prevented from being coupled to other conductive layers. Furthermore, the multi-layer 528 and the insulating barrier layer 520 are also formed on the bottom surface of the lowest insulating layer 510a exposed in the space 518 of the trench 506. Accordingly, the trench 516 is not coupled to the space 518 of the trench 506, but isolated at least by the insulating barrier layer 520. Consequently, the pipe channel layer 530C may be prevented from being exposed through the trench 516 and damaged in the etch process for forming the trench 516.

Figure 5G:
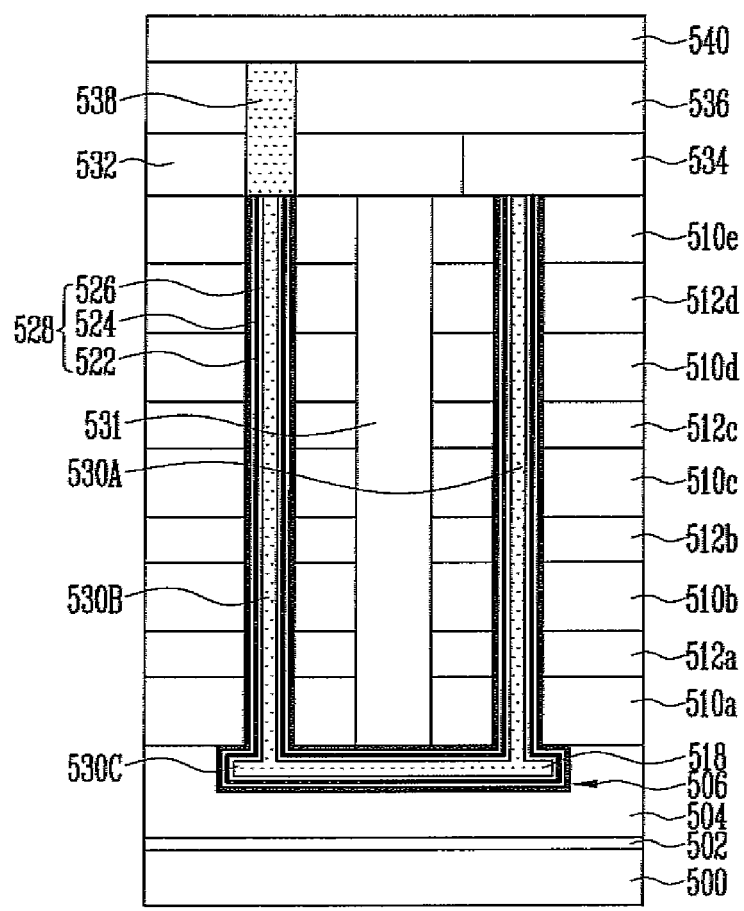

Referring to FIG. 5G, the trench is filled with an insulating layer 531. Next, after an interlayer dielectric layer 532 is formed on the entire structure, a polishing process may be performed. According to an example, the insulating layer 531 and the interlayer dielectric layer 532 are made of the same material. The interlayer dielectric layer 532 may be filled up to the trench. In this case, the insulating layer 531 may be omitted.

Next, a trench is formed by etching part of the interlayer dielectric layer 532 so that the first vertical channel layer 530A is exposed. The trench is filled with a conductive layer 534. The conductive layer 534 formed within the trench is used as a source line (refer to SL of FIG. 4).

After forming the conductive layer 534, an interlayer dielectric layer 536 is formed on the entire structure. Furthermore, a contact hole is formed by etching the interlayer dielectric layers 532 and 536 so that the second vertical channel layer 530B is exposed. Next, a contact plug 538 is formed within the contact hole. A metal line 540 coupled to the contact plug 538 is formed on the interlayer dielectric layer 536. The metal line 540 is used as a bit line (refer to BL of FIG. 4).

Accordingly, the memory string having the 3-D structure is completed.

Meanwhile, yet another embodiment in which the insulating barrier layer is formed on a top surface of the pipe gate conductive layer in order to protect the multi-layer and prevent the pipe channel layer from being exposed in the etch process for forming the trench is described as follows.

Figure 6:
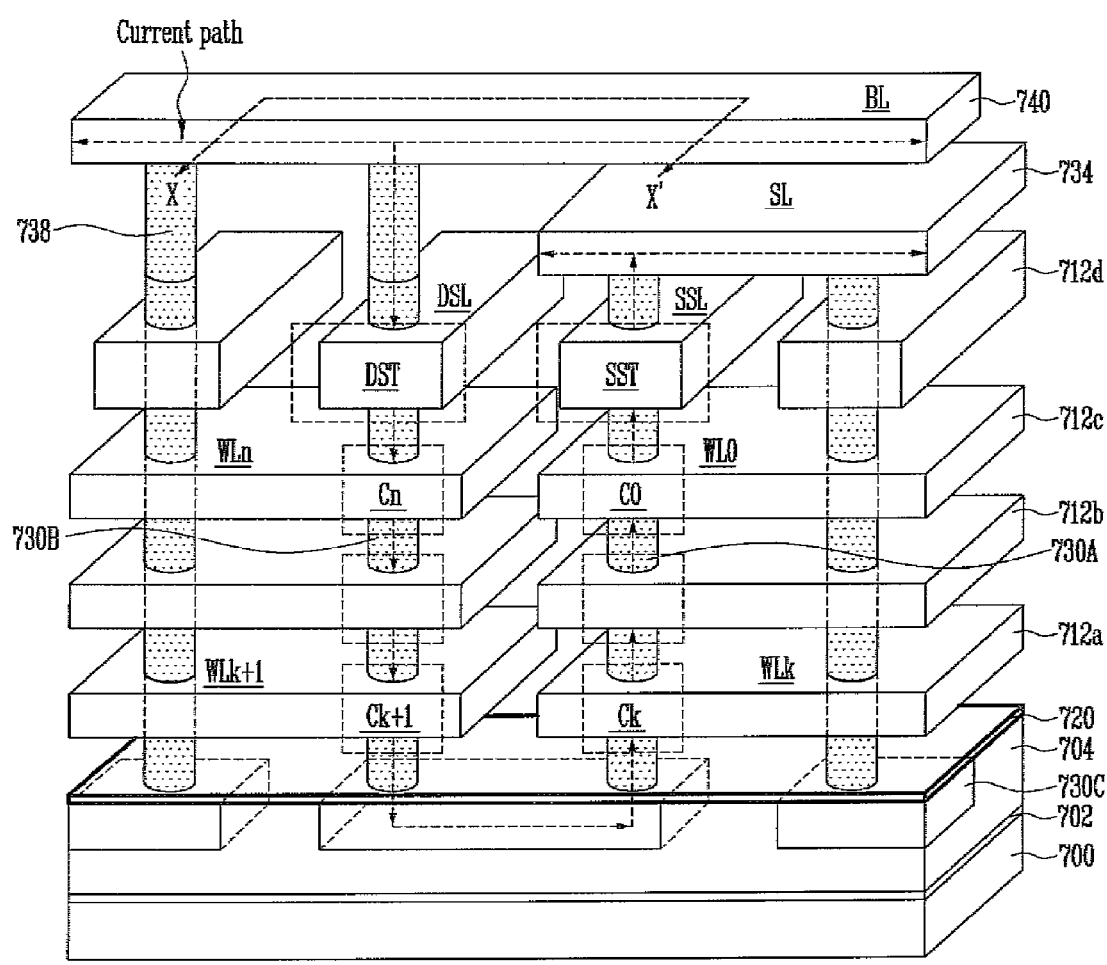
FIG. 6 is a perspective view illustrating the structure of the semiconductor device according to yet another exemplary embodiment of this disclosure.

FIG. 6 is a perspective view illustrating the structure of the semiconductor device according to yet another exemplary embodiment of this disclosure.

Referring to FIG. 6, compared as the structure described with reference to FIG. 1B, an insulating barrier layer 720 may be further included. A multi-layer (refer to 728 of FIG. 7D), including a charge trap layer, is formed on a surface of vertical channel layers 730A and 730B and a pipe channel layer 730C. Furthermore, insulating layers (refer to 710a to 710e FIG. 7A) are alternately formed with conductive layers 712a to 712d. The insulating barrier layer 720 is formed on the bottom surface of the lowest insulating layer 710a among the insulating layers 710a to 710e. In other words, the insulating barrier layer 720 is formed on a pipe gate conductive layer 704. Therefore, the insulating barrier layer 720 is formed on a surface of the multi-layer formed on the top of the pipe channel layer 730C.

Figure 7A:
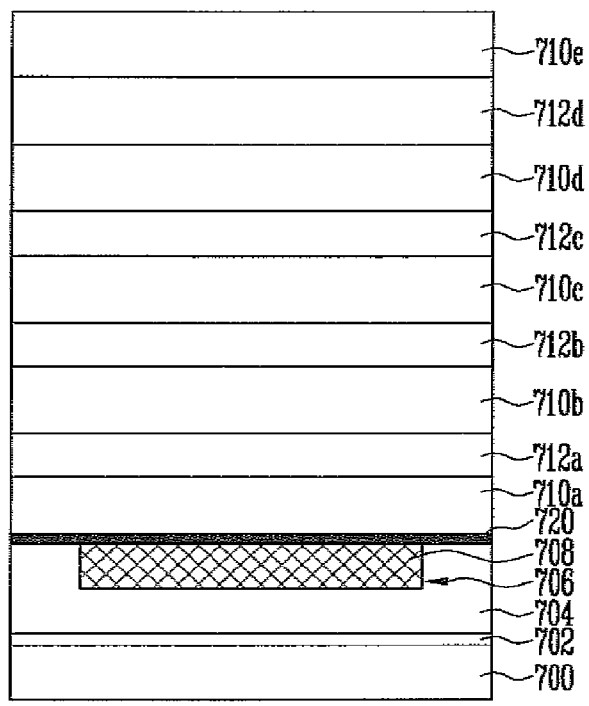
FIGS. 7A to 7G are cross-sectional views of the semiconductor device taken along line X-X' in FIG. 6 in order to illustrate a method of manufacturing the semiconductor device according to yet another exemplary embodiment of this disclosure.
Figure 7B:
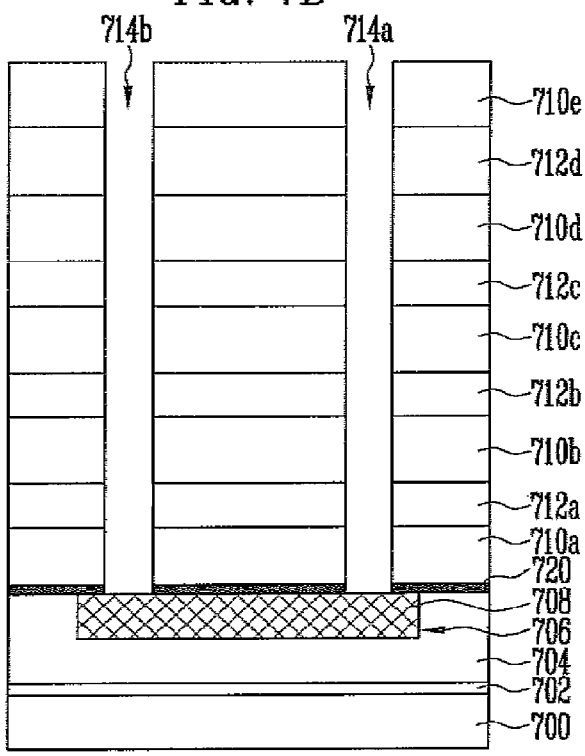
Figure 7C:
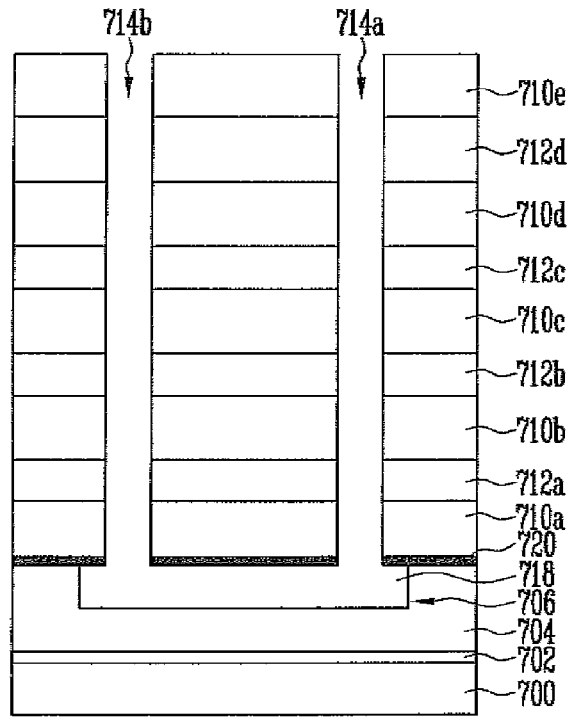
Figure 7D:
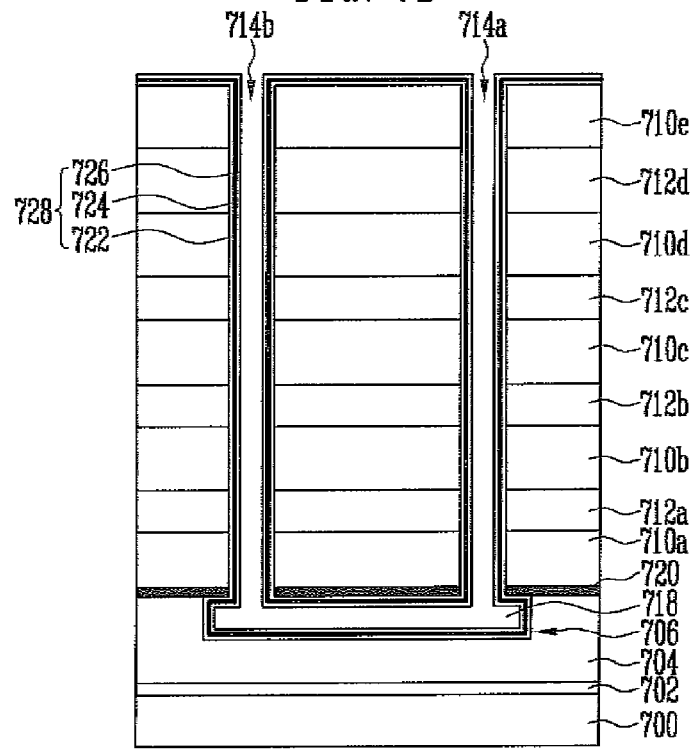
Figure 7E:
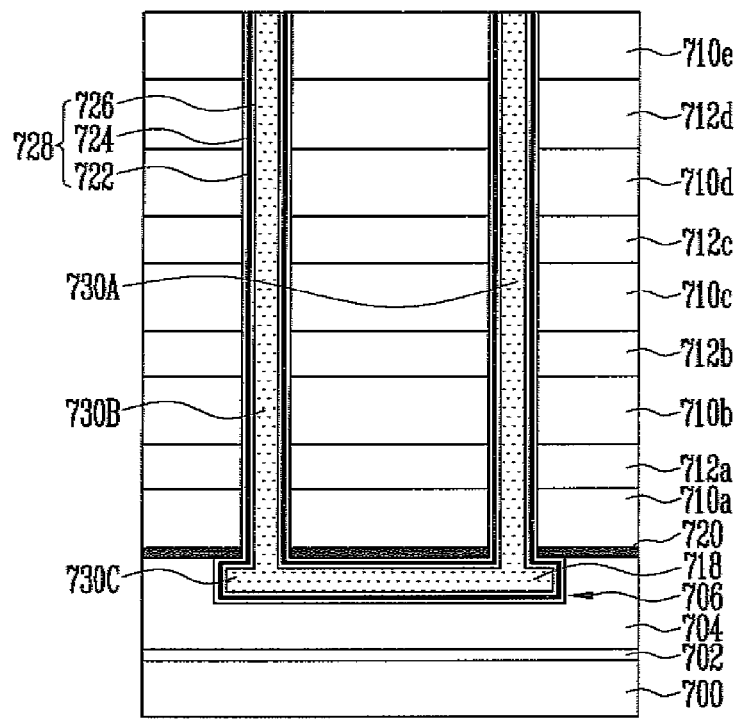
Figure 7F:
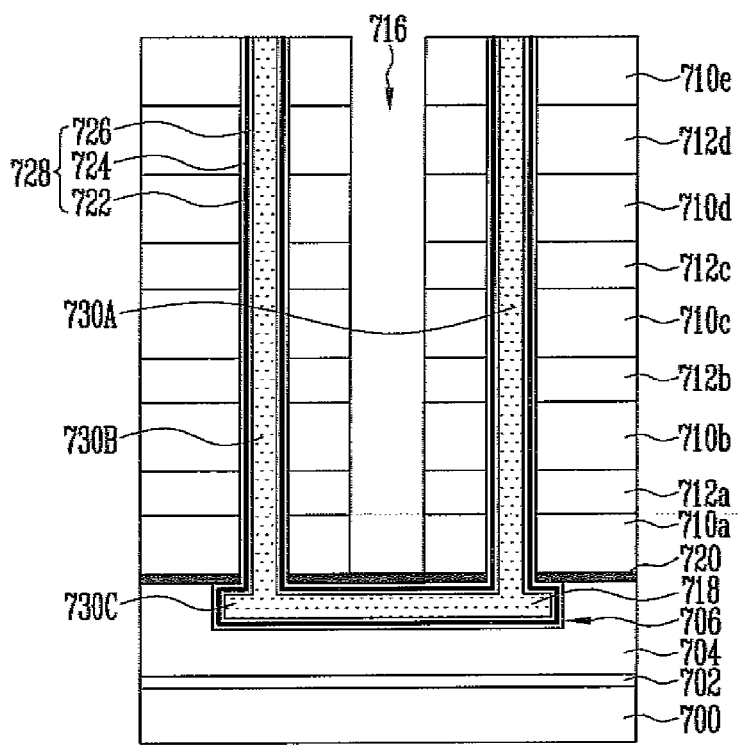

The insulating barrier layer 720 is formed to prevent the multi-layer 728 from being etched or the pipe channel layer 730C from being exposed, when etching the insulating layers 710a to 710e and the conductive layers 712a to 712d in order to form a trench (refer to 716 of FIG. 7F). Accordingly, the insulating barrier layer 720 according to an example is made of material having a zero etching rate in response to an etchant (an etch gas or an etching solution) for etching the conductive layer 712a or the insulating layer 710a formed between the conductive layer 712a and the substrate 700. For example, the insulating barrier layer 720 may be formed of a nitride layer. Further, the insulating barrier layer 720 may be formed of an insulating layer having a higher dielectric constant than the layers of the multi-layer. For example, the insulating barrier layer 520 may be formed of an $Al_2O_3$ layer or an $HfO_2$ layer.

A method of manufacturing the semiconductor device including the above-described insulating barrier layer 720 is described as follows.

FIGS. 7A to 7G are cross-sectional views of the semiconductor device taken along line X-X' in FIG. 6 in order to illustrate the method of manufacturing the semiconductor device according to yet another exemplary embodiment of this disclosure.

Referring to FIG. 7A, an insulating layer 702 is formed on a substrate 700. The conductive layer 704 for forming a pipe gate is formed on the insulating layer 702. A trench 706 is formed by etching part of the pipe gate conductive layer 704. Furthermore, the trench 706 is filled with a sacrificial layer 708.

The insulating barrier layer 720 is formed on the entire structure including the sacrificial layer 708. Next, the plurality of insulating layers 710a to 710e and the plurality of conductive layers 712a to 712d are formed by alternately forming the insulating layer and the conductive layer over the insulating barrier layer 720.

The insulating barrier layer 720 may be formed of a nitride layer. Furthermore, the insulating barrier layer 720 may be formed of an insulating layer which has a smaller etching rate than the conductive layers 712a to 712d or the insulating layers 710a to 710e in response to an etchant for etching the conductive layers 712a to 712d or the insulating layers 710a to 710e and which has a higher dielectric constant than the charge trap layer 724 or the insulating layers 722 and 726 of the multi-layer 728 (refer to FIG. 7D). For example, the insulating barrier layer 720 may be formed of high-k insulating layer, such as an $Al_2O_3$ layer or an $HfO_2$ layer. Exemplary features of an exemplary embodiment when the insulating barrier layer 720 is formed of the nitride layer and the high-k insulating layer are described later.

Referring to FIG. 7B, first and second channel holes 714a and 714b are formed by etching part of the insulating layers 710a to 710e, the conductive layers 712a to 712d, and the insulating barrier layer 720 so that the corresponding regions of the sacrificial layer 708 are exposed. The channel holes 714 and 714b are formed to define respective regions in which the first and second vertical channel layers 730A and 730B will be formed.

Referring to FIG. 7C, the sacrificial layer is removed. Accordingly, a space 718 is formed in the trench 706 of the pipe gate conductive layer 704. If the insulating barrier layer 720 is formed of the nitride layer, the insulating barrier layer 720 and the sacrificial layer may be removed by the same etch process. However, if the insulating barrier layer 720 under the lowest insulating layer 710a is over etched, by-products from etching may remain because a space is formed between the lowest insulating layer 710a and the pipe gate conductive layer 704. However, if the insulating barrier layer 720 is formed of the high-k insulating layer, the by-products may be minimized. Accordingly, the insulating barrier layer 720 may be formed of the high-k insulating layer to prevent the occurrence of by-products.

Referring to FIG. 7D, the multi-layer 728, including the insulating layers 722 and 726 and the charge trap layer 724, is formed on the entire structure, including the sidewalls of the first and the second channel holes 714a and 714b and the inner surface of the trench 706 of the pipe gate conductive layer 704. For example, the multi-layer 728 may have a stack structure, including an oxide layer, a nitride layer, and an oxide layer.

Referring to FIG. 7E, a channel layer is formed on the entire structure so that the first and the second channel holes 714a and 714b and the trench 706 of the pipe gate conductive layer 704 are filled. The channel layer may be formed of a polysilicon layer. Next, the channel layer and the multi-layer, formed over the highest insulating layer 710e of the insulating layers 710a to 710e, are removed by a chemical mechanical polishing process, an etch-back process, or both.

Accordingly, the first and the second channel holes 714a and 714b and the trench 706 of the pipe gate conductive layer 704 are filled with the channel layers 730A, 730B, and 730C. Furthermore, the multi-layer 728 remains, for example, only within the first and the second channel holes 714a and 714b and the space 718 of the pipe gate conductive layer 704. In other words, the channel layers 730A, 730B, and 730C are surrounded with the multi-layer 728, within the first and the second channel holes 714a and 714b and the trench 706 of the pipe gate conductive layer 704. The insulating barrier layer 720 remains under the lowest insulating layer 710a, and a surface of the multi-layer 728 formed on the channel layer 730C is protected by the remaining insulating barrier layer 720.

The first vertical channel layer 730A is formed of the polysilicon layer within the first channel hole 714a. The second vertical channel layer 730B is formed of the polysilicon layer within the second channel hole 714b. The pipe channel layer 730C is formed of the polysilicon layer within the trench 706 of the pipe gate conductive layer 704.

Referring to FIG. 7F, in order to define pairs of word lines in different layers by dividing the conductive layers 712a to 712d, the trench 716 is formed by etching part of the insulating layers 710a to 710e and the conductive layers 712a to 712d. The trench 716 is formed in a line form between the first and the second vertical channel layers 730A and 730B and is formed in a direction to cross the direction of the bit line BL.

The conductive layer may not be formed in the trench 716 because the trench 716 is formed after the pipe channel layer 730C is formed as described above. Accordingly, although the pipe channel layer 730C is exposed in the etch process for forming the trench 716, the pipe channel layer 730C may be prevented from being coupled to other conductive layers. Furthermore, although the etch process for forming the trench 716 is performed, the insulating barrier layer 720 may prevent the pipe channel layer 730C from being exposed. Accordingly, an occurrence of etch damage min the pipe channel layer 730C may be prevented.

Figure 7G:
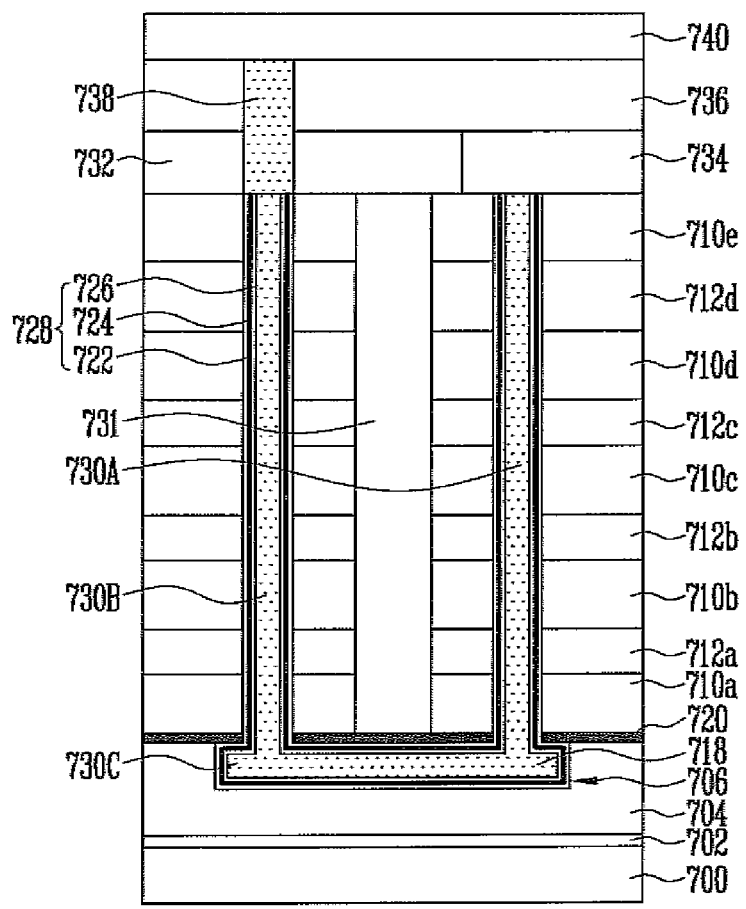

Referring to FIG. 7G, the trench is filled with an insulating layer 731. After an interlayer dielectric layer 732 is formed on the entire structure, a polishing process may be performed. The insulating layer 731 and the interlayer dielectric layer 732 according to an example are made of the same material. That trench may also be filled with the interlayer dielectric layer 732. In this case, the insulating layer 731 may be omitted.

Next, a trench is formed by etching part of the interlayer dielectric layer 732 so that the first vertical channel layer 730A is exposed. The trench is filled with a conductive layer 734. The conductive layer 734 formed in the trench is used as a source line (refer to SL of FIG. 6).

Next, an interlayer dielectric layer 736 is formed on the entire structure. A contact hole is formed by etching the interlayer dielectric layers 732 and 736 so that the second vertical channel layer 730B is exposed. A contact plug 738 is formed in the contact hole. A metal line 740 coupled to the contact plug 738 is formed on the interlayer dielectric layer 736. The metal line 740 is used as the bit line (refer to BL of FIG. 6).

Accordingly, the memory string having the 3-D structure is completed.

In accordance with the exemplary embodiments, the insulating barrier layer is formed under the bottom surface of the lowest insulating layer, i.e., between the pipe channel layer and the lowest insulating layer.

Figure 8:
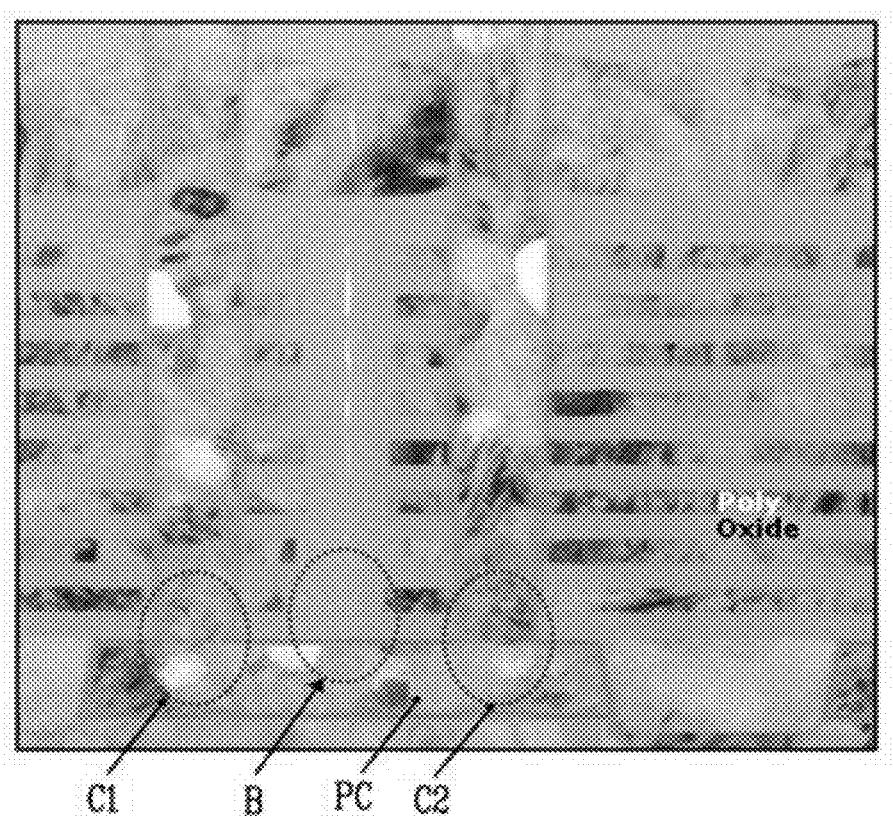
FIG. 8 is a perspective view illustrating the cross section of the semiconductor device manufactured according to the method of FIGS. 7A to 7G.

FIG. 8 is a perspective view illustrating the cross section of the semiconductor device manufactured according to the method of FIGS. 7A to 7G.

Referring to FIG. 8, a pipe channel layer PC is coupled to vertical channel layers on both ends C1 and C2, but the pipe channel layer PC is not exposed in a region B in which a trench is formed. Accordingly, the pipe channel layer PC is prevented from being coupled to other conductive layers.

In accordance with the semiconductor device and the method of manufacturing the same according to the exemplary embodiments, structural stability of a memory string having a 3-D structure and reliability of a manufacturing process thereof may be increased.

What is claimed is:

1. A semiconductor device, comprising:
    a pipe channel layer formed over a substrate;
    a first vertical channel layer formed over the pipe channel layer to couple the pipe channel layer to a bit line;
    a second vertical channel layer formed over the pipe channel layer to couple the pipe channel layer to a source line;
    a multi-layer comprising a charge trap layer and formed to surround the first vertical channel layer, the second vertical channel layer, and the pipe channel layer;
    an insulating barrier layer formed to completely surround the multi-layer formed on the pipe channel layer;
    a plurality of first conductive layers formed between the pipe channel layer and the bit line, wherein the first vertical channel layer passes through the first conductive layers; and
    a plurality of second conductive layers formed between the pipe channel layer and the source line, wherein the second vertical layer passes through the second conductive layers.

2. The semiconductor device of claim 1, further comprising:
    an insulating layer formed on the substrate;
    a pipe gate conductive layer formed on the insulating layer; and
    a trench formed in the pipe gate conductive layer, wherein the pipe channel layer is formed within the trench.

3. The semiconductor device of claim 1, wherein the multi-layer comprises:
    a tunnel insulating layer formed to surround the first vertical channel layer, the second vertical channel layer, and the pipe channel layer;
    the charge trap layer formed to surround the tunnel insulating layer;
    and a blocking insulating layer formed to surround the charge trap layer.

4. The semiconductor device of claim 1, wherein the multi-layer further comprises a tunnel insulating layer formed to surround the first vertical channel layer, the second vertical channel layers, and the pipe channel layer, wherein the charge trap layer is formed between the tunnel insulating layer and the insulating barrier layer.

5. The semiconductor device of claim 1, wherein the insulating barrier layer is formed of an insulating layer having a higher dielectric constant than the charge trap layer included in the multi-layer.

6. The semiconductor device of claim 5, wherein the insulating barrier layer is formed of an Al2O3 layer or an HFO2 layer.

7. The semiconductor device of claim 1, wherein the insulating barrier layer is made of a material having a smaller etching rate than the first conductive layers and the second conductive layers in response to an etchant for etching the first conductive layer and the second conductive layer.

8. The semiconductor device of claim 7, wherein the insulating barrier layer is formed of a nitride layer.

9. The semiconductor device of claim 7, wherein the insulating barrier layer is formed of an Al2O3 layer or an HfO2 layer.

10. A semiconductor device, comprising:
    a pipe channel layer formed over a substrate;
    a first vertical channel layer formed over the pipe channel layer to couple the pipe channel layer to a bit line;
    a second vertical channel layer formed over the pipe channel layer to couple the pipe channel layer to a source line;
    a multi-layer comprising a charge trap layer and formed to surround the first vertical channel layer, the second vertical channel layer, and the pipe channel layer;
    a plurality of first conductive layers formed between the pipe channel layer and the bit line, wherein the first vertical channel layer passes through the first conductive layers;
    a plurality of second conductive layers formed between the pipe channel layer and the source line, wherein the second vertical layer passes through the second conductive layers;
    insulating layers formed alternately with the first and the second conductive layers, respectively; and
    an insulating barrier layer formed between the multi-layer formed on the pipe channel layer and a lowest insulating layer of the insulating layers.

11. The semiconductor device of claim 10, further comprising:
    an insulating layer formed on the substrate;
    a pipe gate conductive layer formed on the insulating layer; and
    a trench formed in the pipe gate conductive layer,
    wherein the pipe channel layer is formed within the trench.

12. The semiconductor device of claim 10, wherein the multi-layer comprises:
    a tunnel insulating layer formed to surround the first vertical channel layer, the second vertical channel layers, and the pipe channel layer;
    the charge trap layer formed to surround the tunnel insulating layer; and
    a blocking insulating layer formed to surround the charge trap layer.

13. The semiconductor device of claim 10, wherein the insulating barrier layer is formed of an insulating layer having a higher dielectric constant than the charge trap layer included in the multi-layer.

14. The semiconductor device of claim 13, wherein the insulating barrier layer is formed of an Al2O3 layer or an HfO2 layer.

15. The semiconductor device of claim 10, wherein the insulating barrier layer is made of a material having a smaller etching rate than the first conductive layers, the second conductive layers, and the insulating layers in response to an etchant for etching the first conductive layers, the second conductive layers, and the insulating layers.

16. The semiconductor device of claim 15, wherein the insulating barrier layer is formed of a nitride layer.

17. The semiconductor device of claim 15, wherein the insulating barrier layer is formed of an Al2O3 layer or an HfO2 layer.

* * * * *